United States Patent [19]

Stein

[11] Patent Number: 4,989,935
[45] Date of Patent: Feb. 5, 1991

[54] OPTOELECTRONIC TRANSMITTER AND RECEIVER

[75] Inventor: Karl-Ulrich Stein, Unterhaching, Fed. Rep. of Germany

[73] Assignee: Siemens Aktiengesellschaft, Berlin and Munich, Fed. Rep. of Germany

[21] Appl. No.: 408,561

[22] Filed: Sep. 18, 1989

[30] Foreign Application Priority Data

Sep. 30, 1988 [DE] Fed. Rep. of Germany ....... 3833311

[51] Int. Cl.$^5$ .............................................. G02B 6/12
[52] U.S. Cl. .............................. 350/96.11; 350/96.17; 350/96.20; 357/40
[58] Field of Search ............... 350/96.11, 96.12, 96.14, 350/96.15, 96.17, 96.20; 370/1, 3; 357/40, 44, 51

[56] References Cited

U.S. PATENT DOCUMENTS

| | | | |
|---|---|---|---|
| 4,466,696 | 8/1984 | Carney | 350/96.20 |
| 4,592,619 | 6/1986 | Weidel | 350/96.11 |
| 4,760,569 | 7/1988 | Mahlein | 370/3 |
| 4,762,382 | 8/1988 | Husain et al. | 350/96.12 |
| 4,767,171 | 8/1988 | Keil et al. | 350/96.18 |
| 4,892,374 | 1/1990 | Ackerman et al. | 350/96.15 |

FOREIGN PATENT DOCUMENTS

| | | |
|---|---|---|
| 590385 | 2/1987 | Australia . |
| 3605248 A1 | 9/1987 | Fed. Rep. of Germany . |
| 3713067 A1 | 3/1988 | Fed. Rep. of Germany . |
| 3730971 A1 | 3/1989 | Fed. Rep. of Germany . |
| 3731311 A1 | 3/1989 | Fed. Rep. of Germany . |

OTHER PUBLICATIONS

Suematsu et al., "Integrated Optics Approach for Advanced Semiconductor Lasers", IEEE, vol. 75, No. 11, Nov. 1987, pp. 1472–1487.

Primary Examiner—John D. Lee
Attorney, Agent, or Firm—Hill, Van Santen, Steadman & Simpson

[57] ABSTRACT

An optoelectronic transmission and reception device includes an optical transmitter inserted into a silicon wafer as a laser chip composed of III/V compound semiconductor material, an optical receiver inserted into the silicon wafer as a reception diode chip composed of III/V compound semiconductor material or which is monolithically integrated into the silicon wafer as a metal-semiconductor diode. A coupling optics for connection to an optical fiber is monolithically integrated into the silicon wafer, as is a controller that includes a drive circuit for the transmitter and a preamplifier circuit for the receiver, a wavelength selective beam splitter and light wave guides for light guidance. The device is particularly useful as a bi-directional transmission and reception module.

25 Claims, 1 Drawing Sheet

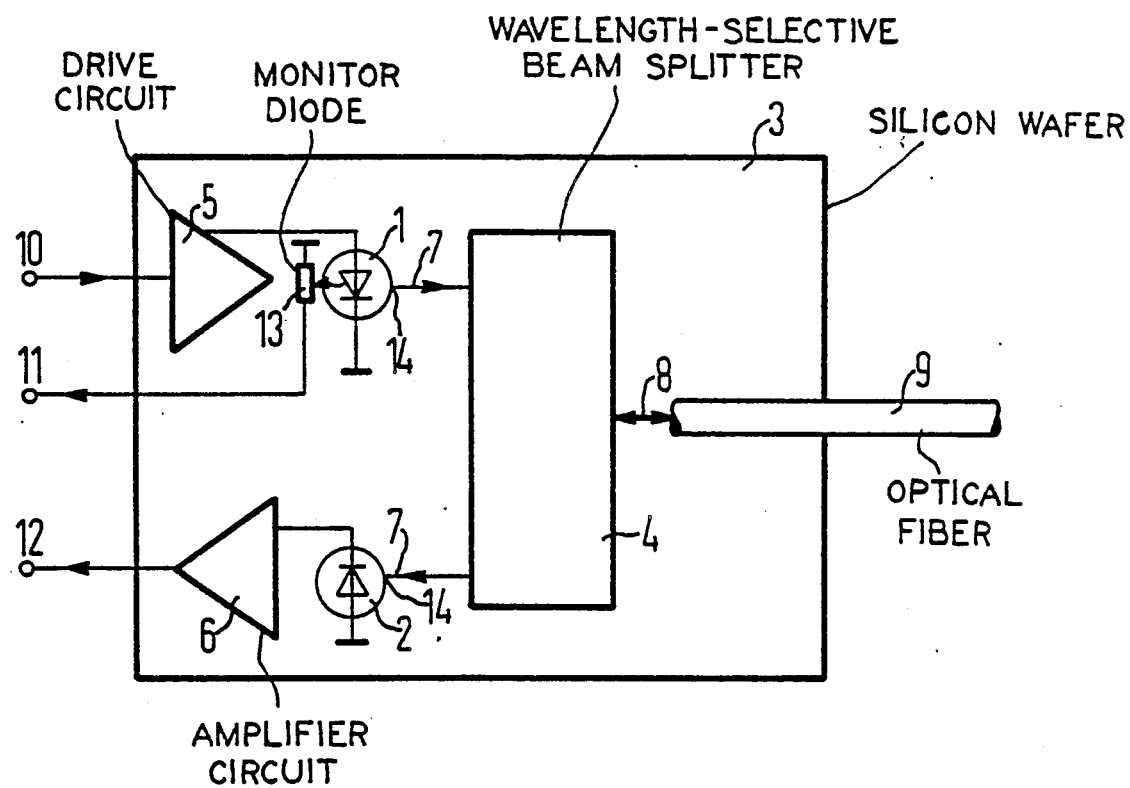

OPTOELECTRONIC TRANSMITTER AND RECEIVER

BACKGROUND OF THE INVENTION

1. Field of the Invention

The present invention is directed generally to an optoelectronic transmitter and receiver device which, in particular, includes an optical transmitter, an optical receiver, a wavelength selective beam splitter, coupling optics having a connection to an optical fiber, and a controller that encompasses a drive circuit for the optical transmitter and a pre-amplifier circuit for the optical receiver.

2. Description of the Related Art

Constructing light wave guide components with optical and optoelectronic transmission and reception functions is relatively involved since the vastly different functions to be performed by such components require different materials which must be joined in a hybrid structure. This is particularly true of bi-directional transmission and reception units, or modules, that are the key components for broad band subscriber terminals. This technology will only enjoy desirable, broad utilization when such a transducer can be manufactured cost effectively.

Efforts have already been made to build such transmitter and receiver devices at an optimal low cost. As a result, a so-called free beam module is currently being developed. This involved a mounting technique having very many separate parts made of the greatest variety of materials. In addition, efforts have been undertaken to overcome this problem with multichip units having optical and optoelectronic chips composed of III/V compound semiconductors.

SUMMARY OF THE INVENTION

In optoelectronic transmitter and receiver devices as described in the foregoing, it is an object of the invention to integrate an optimum plurality of discrete parts in a semiconductor component which requires little outlay in formatting technology, which can be relatively easily manufactured, and which is cost effective.

This and other objects and advantages of the invention are achieved in a device having an optical transmitter inserted in a silicon wafer as a laser chip, or diode, composed of III/V compound semiconductor material. An optical receiver is also inserted into the silicon wafer and is formed of a receptor diode chip composed of III/V compound semiconductor material or, instead, the optical receiver can be monolithically integrated in the silicon wafer as a metal-semiconductor diode. A wavelength selective beam splitter, a control means, light wave guides required for light guidance, and coupling optics are monolithically integrated into the same silicon wafer. In a particular embodiment, a platinum silicide Schottky barrier diode is integrated into the silicon wafer as a metal-semiconductor reception diode.

Advantageous developments and improvements of the invention include forming the light wave guides as silicon ridges or as strip lines having optically active, doped layers in the silicon or as silicon/oxide/oxinitride layers on silicon. The aforementioned coupling optics encompasses means for joining, or fastening, the silicon wave guide with a connecting optical fiber and may include a depression or groove in the silicon wafer for fastening the connecting fiber. In a particular embodiment, the coupling optics uses the principle of butt coupling. Alternately, the coupling optics is a bonded connection (executed as a fiber splice) at an end of the light wave guide which is fashioned as a tongue for connection with the connecting optical fiber.

Particular embodiments of the wave length selective beam splitter include either a directional coupler or a surface grating. The control means of preferred embodiments uses a monitor diode or a bolometer integrated into the control means for measuring and converting light power. The required electrical interconnects are integrated into the silicon wafer using integrated circuit technology.

To amplify electrical signals in the transmission and reception device, either transistors formed using metal-semiconductor-PtSi techniques or broad band amplifiers are monolithically integrated into the silicon wafer. The preferred species of III/V compound semiconductor material is InP/InGaAsP. For driving the transmitter, the drive circuit is preferably integrated into the laser diode chip and/or, for the receiver, the pre-amplifier circuit is integrated into the reception diode chip. Finally, the complete arrangement for use as the optoelectronic transmission and reception module is applied onto a bottom plate or onto a lead frame and is provided with an encapsulation as well as with an optical fiber connection.

The invention is comprised of an optoelectronic transmission/reception means that is manufactured using a largely monolithic silicon construction technique instead of being manufactured from a plurality of discrete parts. A characteristic which is thereby utilized is that the silicon is nearly fully transparent in the appertaining wavelength range of the first transmission window (about 1.3 $\mu$m) and of the second transmission window (about 1.5 $\mu$m). This construction technique utilizes silicon micromechanics technology and IC technology to integrated the required mechanical, optical and electronic functions into a single silicon wafer insofar as possible. At most two assemblies, namely the electro-optical transducer, or laser, and, as warranted, the optoelectronic transducer, or receptor diode, are exceptions, these being capable of being inserted as chips into the silicon wafer. These inserted chips may possibly also include means for performing the appertaining amplifier functions. The chip portions to be inserted or emplaced are composed of a III/V semiconductor base material, preferably of InP/InGaAsP.

The remaining functions are provided by means in the silicon, for example in the following way:

Conducting light: Dielectric light guide(s) are formed as silicon ridges or as strip lines having optically active, doped layers in silicon or in silicon/oxide/oxinitride layers on the silicon function to conduct light.

Coupling light into the fiber: An arrangement of one of the silicon light guides adjacent a depression or channel in the wafer for fastening the fiber is included. The coupling can be accomplished by application of the butt coupling principle; alternately, the coupling optics can be a bonded connection, which is executed as a fiber splice, at an end of the light wave guide which has been formed as a tongue to connect the fiber.

Focusing light: Lenses or Fresnel optics are provided in the wafer which are manufactured using silicon micromechanical techniques.

Current conduction or electrical insulation: Conductive interconnects which lie either in or on the silicon wafer and insulating regions as are known in integrated circuit technology are provided.

Measuring and converting the light power: The receptor diode and/or monitor diode are introduced into the silicon wafer as metal-semiconductor diodes, and particularly as platinum silicide Schottky barrier diodes. Alternately, a bolometer is used in a bridge circuit that is manufactured with diffused silicon regions, diodes or transistors as sensor elements, the bolometer reacting to the emission of a laser chip which has been converted into heat or by measuring the temperature of the laser chip integrated into the silicon.

Filtering or screening of light: Metallic and dielectric layers on the silicon or, respectively, optical gratings in or on the surface of the silicon may be provided. The function of filtering the light for the various wavelengths is performed by a directional coupler with wave guides in silicon or as a surface grating to provide, for example, a wavelength-division-multiplexing filter (WDM).

Amplifying electrical signals: Transistors in metal-semiconductor-PtSi technology are used as amplifiers for the reception diodes, or standard integrated broad band amplifiers in silicon may be used instead.

It is a particular advantage of the present invention that the parts can be fabricated in a wafer panel (a whole or portion of a wafer) and can thereby be subjected to preliminary testing and even aging while still in the panel. Only those units which have been found to be fully functional are further processed by mounting. Reworking is thus avoided.

Further processing steps include, for example, mounting the complete arrangement on a bottom plate which serves as a heat sink. The arrangement is then closed to the outside by a cap, and a holder for the light guide fiber is provided. The cap and holder are each carried on the bottom plate.

A further technique that is also taught by the present invention is based on the use of a lead frame strip as the bottom plate and heat sink, the lead frame strip also encompassing the fiber mount or plug mount. This arrangement can be fashioned in an especially cost beneficial way, particularly for radio-frequency demands as well since the data rates of a broad band module extend up into a range above 1 Gbit/sec. The encapsulation of the arrangement in a lead frame structure is executed in the fashion of metal-ceramic technology, for example using glazed-on or glued ceramic and a metal cap or with a plastic envelope. As a mounting technique for the parts, joining the parts using processes of die bonds and wire bonds are especially expedient.

Supplementing the current module construction technique, it is further advantageous that the structuring technique of the invention offers the possibility of making use of metal-semiconductor transistors and metal-semiconductor diodes.

BRIEF DESCRIPTION OF THE DRAWINGS

The Figure is a schematic illustration of an exemplary embodiment of the present invention.

DETAILED DESCRIPTION OF THE PREFERRED EMBODIMENTS

An optoelectronic transmission and reception means is shown in the Figure and is essentially composed of a laser chip, or portion, 1 operating as an optical transmitter and of a photodiode chip, or portion, 2 operating as an optical receiver. Either both of the chips 1 and 2, or only the laser chip 1, are/is composed of III/V compound semiconductor material, which is preferably InP/InGaAsP and are/is inserted into a silicon wafer 3 and secured therein by gluing, for example. As a component part that is monolithically integrated into the silicon wafer 3, the optical receiver 2 is introduced into the wafer 3 as a metal-semiconductor diode and, in particular, as a platinum silicide Schottky barrier diode.

For coupling light in and out, a monomode connecting optical fiber 9 is provided as a light wave guide. For example, a V-shaped groove formed by anisotropic etching is provided for fixing the connecting fiber 9 in place on the silicon wafer 3. As coupling optics 8 for connecting the fiber 9 to a light wave guide 7 which is integrated on the silicon wafer 3, a butt coupler or a wave guide tongue that are bonded to the fiber 9 may be provided. Other suitable connecting or fastening means and methods may also be provided, including so-called "thermosonic" or "nailhead" bonding techniques.

Other component parts which form the present optoelectrical transmitter and receiver device are monolithically integrated in the silicon wafer 3. A directional coupler or other suitable wavelength-multiplexer/demultiplexer is used as a wavelength-selective beam splitter 4. Both a drive circuit 5 for the laser diode 1 as well as an amplifier circuit 6 for the reception diode 2 are monolithically integrated in the silicon wafer 3.

The drive circuit 5, which includes both a controller stage and a driver stage, has an electrical signal input 10, while a monitor diode 13 has an electrical monitor output 11. The preliminary amplifier circuit 6 for the receiver diode 2 has an electrical output 12. The light wave guide 7 has an optical coupling 14 to the transmitter chip 1 and to the receiver chip 2 which may be formed of, for example, a multilayer planar wave guide coupler, a tapered coupler, or a grating coupler.

Thus, there is shown and described an optoelectronic transmission and reception means which finds particular utility as a bi-directional transmission and reception module.

Although modifications and changes may be suggested by those skilled in the art, it is the intention of the inventor to embody within the patent warranted hereon all changes and modifications as reasonably and properly come within the scope of his contribution to the art.

I claim as my invention:

1. An optoelectronic transmitter and receiver device on a silicon wafer, comprising:
    an optical transmitter inserted into the silicon wafer and formed of a laser composed of III/V compound semiconductor material;
    an optical receiver inserted into the silicon wafer and formed of a receptor diode;
    a controller monolithically integrated in the silicon wafer including:
        a drive circuit means for driving said optical transmitter;
        a pre-amplifier circuit means for amplifying output signals from said optical receiver;
    coupling optics on the silicon wafer having a connection for an optical fiber;
    light guides monolithically integrated in the silicon wafer and connected between said coupling optics and said optical transmitter and said optical receiver; and
    a wavelength selective beam splitter in said light guides between said coupling optics and said optical transmitter and said optical receiver for beam splitting, said beam splitter being monolithically integrated into the silicon wafer.

2. An optoelectronic transmitter and receiver device as claimed in claim 1, wherein said light guides are formed as silicon ridges on the silicon wafer.

3. An optoelectronic transmitter and receiver device as claimed in claim 2, wherein said light guides have optically active doped layers in the silicon wafer.

4. An optoelectronic transmitter and receiver device as claimed in claim 2, wherein said light guides have silicon/oxide/oxinitride layers on the silicon wafer.

5. An optoelectronic transmitter and receiver device as claimed in claim 1, wherein said light guides are formed as strip lines on the silicon wafer.

6. An optoelectronic transmitter and receiver device as claimed in claim 5, wherein said light guides have optically active doped layers in the silicon wafer.

7. An optoelectronic transmitter and receiver device as claimed in claim 5, wherein said light guides have silicon/oxide/oxinitride layers on the silicon wafer.

8. An optoelectronic transmitter and receiver device as claimed in claim 1, wherein said coupling optics includes a groove in said silicon wafer adapted for fastening a connecting fiber, said groove being in combination with said light guides.

9. An optoelectronic transmitter and receiver device as claimed in claim 1, wherein said coupling optics is a means for butt-coupling a fiber to said device.

10. An optoelectronic transmitter and receiver device as claimed in claim 1, wherein said coupling optics includes a bonded fiber splice connection having said light guides formed with a tongue at an end.

11. An optoelectronic transmitter and receiver device as claimed in claim 1, wherein said wavelength selective beam splitter is a directional coupler.

12. An optoelectronic transmitter and receiver device as claimed in claim 1, wherein said wavelength selective beam splitter is a surface grating.

13. An optoelectronic transmitter and receiver device as claimed in claim 1, further comprising:
a monitor diode integrated into said controller for measuring and converting light power.

14. An optoelectronic transmitter and receiver device as claimed in claim 1, further comprising:
a bolometer integrated into said controller for measuring and converting light power.

15. An optoelectronic transmitter and receiver device as claimed in claim 1, further comprising:
electronic interconnects integrated into said silicon wafer using integrated circuit technology.

16. An optoelectronic transmitter and receiver device as claimed in claim 1, further comprising:
means for amplifying electrical signals in said device, said means for amplifying being monolithically integrated into said silicon wafer.

17. An optoelectronic transmitter and receiver device as claimed in claim 16, wherein said means for amplifying includes transistors in metal-semiconductor-PtSi technology.

18. An optoelectronic transmitter and receiver device as claimed in claim 16, wherein said means for amplifying includes broad band amplifiers.

19. An optoelectronic transmitter and receiver device as claimed in claim 1, wherein said III/V compound semiconductor material is InP/InGaAsP.

20. An optoelectronic transmitter and receiver device as claimed in claim 1, wherein said drive circuit is integrated into said laser of said optical transmitter.

21. An optoelectronic transmitter and receiver device as claimed in claim 1, wherein said pre-amplifier circuit is integrated into said receptor diode of said optical receiver.

22. An optoelectronic transmitter and receiver device as claimed in claim 1, wherein said receptor diode is a metal-semiconductor platinum silicide Schottky barrier diode monolithically integrated in the silicon wafer.

23. An optoelectronic transmitter and receiver device as claimed in claim 1, further comprising:
a monitor diode which is a metal-semiconductor platinum silicide Schottky barrier diode monolithically integrated in the silicon wafer, said monitor diode being disposed to monitor output from said optical transmitter.

24. An optoelectronic transmitter and receiver device as claimed in claim 1, further comprising:
a bottom plate applied onto a bottom of said optoelectronic transmitter and receiver device;
means for encapsulating said optoelectronic transmitter and receiver device and a light wave guide connected thereto.

25. An optoelectronic transmitter and receiver device as claimed in claim 1, further comprising:
a lead frame applied onto a bottom of said optoelectronic transmitter and receiver device; and
means for encapsulating said optoelectronic transmitter and receiver device and a light wave guide connected thereto.

* * * * *